United States Patent [19]

Yukimoto et al.

[11] Patent Number: 4,493,941
[45] Date of Patent: Jan. 15, 1985

[54] HETERO-FACE SOLAR CELL AND METHOD OF MANUFACTURING THE SAME

[75] Inventors: Yoshinori Yukimoto; Kotaro Mitsui, both of Hyogo, Japan

[73] Assignee: Mitsubishi Denki Kabushiki Kaisha, Tokyo, Japan

[21] Appl. No.: 525,903

[22] Filed: Aug. 24, 1983

[30] Foreign Application Priority Data

Aug. 24, 1982 [JP] Japan .................. 57-148062

[51] Int. Cl.³ ................ H01L 31/06; H01L 31/18
[52] U.S. Cl. ................... 136/255; 136/262; 29/572; 148/1.5; 148/186; 357/30
[58] Field of Search ........... 136/255, 262; 357/30; 148/1.5, 186; 29/572

[56] References Cited

U.S. PATENT DOCUMENTS 4,122,476 10/1978 Hovel et al. .................. 357/16
4,126,930 11/1978 Moon ........................... 29/572
4,235,651 11/1980 Kamath et al. ............... 148/171

OTHER PUBLICATIONS

K. V. Vaidyanathan et al., *Cont. Record*, 10th IEEE Photovoltaic Specialists Cont., (1973), pp. 31–32.

*Primary Examiner*—Aaron Weisstuch
*Attorney, Agent, or Firm*—Sughrue, Mion, Zinn, Macpeak, and Seas

[57] ABSTRACT

In a hetero-face type solar cell, an impurity concentration distribution is formed in the cell element so as to provide an accelerative electric field therein. As a result, electrons are accelerated by the field toward the PN junction, and even under the application of radiation to the cell, a highly efficient solar cell may be achieved.

5 Claims, 4 Drawing Figures

HETERO-FACE SOLAR CELL AND METHOD OF MANUFACTURING THE SAME

BACKGROUND OF THE INVENTION

This invention relates to a solar cell which converts solar energy into electrical energy. More particularly, the invention relates to a solar cell structure of the hetero-face type, and a method of manufacturing the same.

FIG. 1A is a schematic section showing a conventional AlGaAs/GaAs solar cell of the hetero-face structure, which is known as a highly efficient solar cell. In FIG. 1A, reference numeral 1 designates an n-type GaAs substrate; 2, a p-type GaAs layer formed by the diffusion of a p-type impurity, ion injection or an epitaxial growth technique; and 3, a p-type AlGaAs layer formed on the layer 2 by an epitaxial growth technique. It is well known that the solar cell thus constructed has a band-diagram shown in FIG. 1B. Further, there exists an energy difference $\Delta E$ between the p-type GaAs layer 2 and the p-type AlGaAs layer 3, which is equivalent to the bandgap $E_{g1}-E_{g2}$. The existence of this energy difference serves an important role in this solar cell.

The solar cell having the hetero-face structure of FIG. 1A is highly effective in reducing the recombination of carriers at the surface of the p-type GaAs layer 2, so that a highly efficient solar cell is accomplished. However, in this solar cell, a p-type GaAs layer 2 having a high carrier mobility is employed as a main active region. The n-type GaAs substrate 1 is of a low mobility and the amount of incident light arriving at the substrate 1 is small so that the substrate 1 is not efficiently used. In particular, the depletion layer 12 existing around the pn-junction interface scarcely contributes to the generation of photo-current. Electrons generated in response to solar light incidence mainly reside in the p-type GaAs layer 2. The electrons reach the junction by diffusion and enter the n-type GaAs substrate 1 after penetrating the depletion layer region 12 due to a high voltage gradient applied to the pn-junction. Also, holes generated in the n-type substrate 1 enter the p-type GaAs layer 2 by tracing a journey opposite to that of the electrons. In this manner, a photoexcitation current flows by the diffusion of the electrons in the p-type GaAs layer 2 and the holes in the n-type GaAs substrate 1 into the respective opposite conductivity type regions. Accordingly, the device characteristics strongly depend on the diffusion lengths of the minority carriers in the respective regions.

Further, in circumstances tending to reduce the diffusion lengths of the minority carriers, for instance, in space, where radiations such as electrons, protons and γ-rays are applied to the solar cell whereby the diffusion lengths of the carriers are lowered, the efficiency may be abruptly lowered. Furthermore, as the thickness of the p-type GaAs layer 2 increases, the minority carriers generated in the vicinity of the surface of the element, if the diffusion length thereof is short, vanish before they arrive at the pn-junction so that the efficiency may be remarkably lowered.

SUMMARY OF THE INVENTION

The present invention is provided to eliminate the above-described drawbacks. An object of the invention is to provide a novel structure for a solar cell and a manufacturing method for the same, wherein the efficiency is not largely lowered by the application of radiation thereto.

That is, by the use of a novel structure which is little affected even if the diffusion length of the carriers is shortened by the application of radiation, the effect of lowering the diffusion length of the carriers in the p-type GaAs layer 2 and the n-type GaAs substrate 1 may be decreased.

DETAILED DESCRIPTION OF THE PREFERRED EMBODIMENT

Figure 1A:
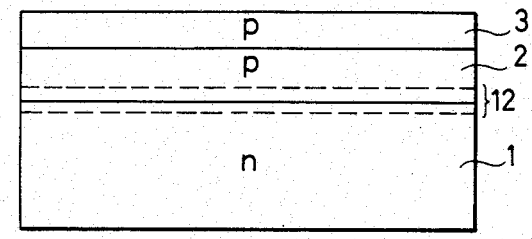
FIG. 1A is a schematic section showing a conventional solar cell having a hetero-face structure.
Figure 1B:
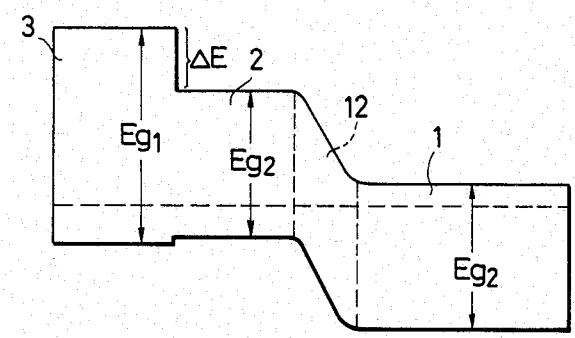
FIG. 1B is a band-diagram of the solar cell of FIG. 1A.
Figure 2A:
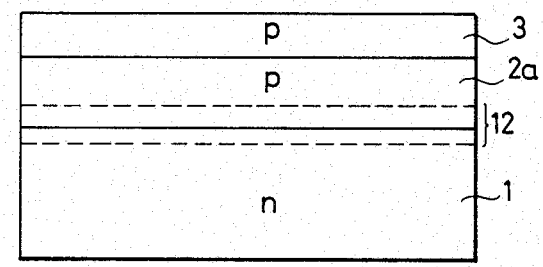
FIG. 2A is a schematic section showing a solar cell of one embodiment according to the present invention.

FIG. 2A is a schematic section showing a solar cell according to one embodiment of the present invention. In FIG. 2A, departing from the conventional example shown in FIG. 1A, the p-type GaAs layer 2a is not a single structure similar to that of FIG. 1. That is, an impurity concentration distribution is provided in the p-type GaAs layer 2a so as to obtain an accelerative electric field for electrons in a conductive band thereof against the Fermi level f as shown in the band diagram of FIG. 2B.

Although a so-called graded bandgap structure has been proposed to obtain such an accelerative electric field, such structure is difficult in realization and has been lacking in practical use.

According to the present invention, after initial formation as shown in FIG. 1, the impurity concentration distribution is provided using an impurity diffusion or ion-injection technique or the like, so that the accelerative electric field is generated therein. Therefore, the realization of the device is comparatively easy.

In this embodiment, the p-type GaAs layer 2a has a graded concentration distribution with respect to the p-type impurity. Therefore, an electric field which accelerates electrons in the direction of the pn-junction is generated so that the carriers (electrons) enter the n-type GaAs substrate 1 through the depletion region 12 more abruptly than in the case of the conventional diffusion phenomenon. Accordingly, even if the carrier lifetime is reduced by the application of radiation, the carriers are accelerated so that carrier drift is completed without increasing the vanishing degree of the carriers.

In the formation of such a structure, after an element having the structure shown in FIG. 1A is formed beforehand, it is easy to form the p-type GaAs layer 2a having the graded impurity concentration distribution by diffusing a p-type impurity, for instance zinc, through the thin (0.1–0.5 μm) AlGaAs layer 3 into the GaAs layer 2. Further, it is easy to obtain an impurity concentration distribution having a profile such as shown in FIG. 2B by controlling the injection energy and dose amount using an ion-injection apparatus.

Figure 2B:
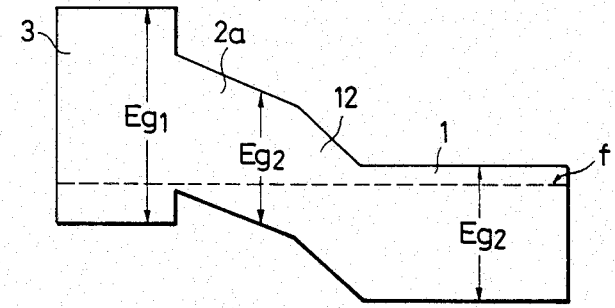
FIG. 2B is a band-diagram of the solar cell of FIG. 2A.

Furthermore, as an application of the present invention, for instance, by changing the kind and concentration of the impurity, it is possible to enlarge the depletion region 12 by doping so as to compensate a part of the p-type conductivity in a region in the vicinity of the pn-junction of the p-type GaAs layer 2a in the band-profile as shown in FIG. 2B.

Moreover, the present invention may be applied to solar cells other than the GaAs solar cell described above.

As described above, according to the present invention, in a solar cell having a hetero-face structure including a semiconductor substrate of a first conductivity type, a first semiconductor layer of a second conductivity type having a forbidden band gap equivalent to that of the substrate and formed on the substrate and a second semiconductor layer of the second conductivity type having a wide forbidden band gap formed on the first semiconductor layer, a concentration gradient of the second conductivity type impurity is formed in the first semiconductor layer so as to distribute a high concentration at the side of the second semiconductor layer and a low concentration at the side of the substrate, so that a high efficiency solar cell may be obtained even under the application of radiation, by electrically accelerating the carriers.

Further, after the formation of the second semiconductor layer, the second conductivity type impurity may be injected through the second semiconductor layer into the first semiconductor layer so that the control of the impurity may be easily effected and a predetermined band-profile may be very easily obtained.

What is claimed is:

1. A solar cell, comprising:
    a semiconductor substrate of a first conductivity type;
    a first semiconductor layer of a second conductivity type formed on said semiconductor substrate, said first semiconductor layer having a forbidden band-gap equivalent to that of said semiconductor substrate;
    a second semiconductor layer of said second conductivity type having a forbidden band-gap wider than that of said first semiconductor layer formed on said first semiconductor layer;
    an impurity concentration of a second conductivity type impurity being gradiently distributed in said first semiconductor layer so as to form an accelerative electric field in the direction of the junction between said first semiconductor layer and said substrate, said impurity concentration gradiently decreasing from the surface mating with said second semiconductor layer to the junction with said substrate.

2. A solar cell as claimed in claim 1 wherein said substrate and said first semiconductor layer are GaAs layers and said second semiconductor layer is a layer of AlGaAs.

3. A method of manufacturing a solar cell, comprising the steps of:
    (a) preparing a semiconductor substrate of a first conductivity type;
    (b) forming a first semiconductor layer having a forbidden band-gap equivalent to that of said substrate, and a second semiconductor layer having a forbidden band-gap wider than that of said first semiconductor layer on said substrate in the stated order; and
    (c) introducing and penetrating a second conductivity type impurity from a main surface of said second semiconductor into said first semiconductor layer so as to distribute the impurity concentration gradiently so as to form an accelerative electric field in the direction of the junction between said first semiconductor layer and said substrate.

4. The method as claimed in claim 3, wherein the introduction of said impurity is carried out according to a diffusion technique.

5. The method as claimed in claim 3, wherein the introduction of said impurity is carried out by an ion-injection technique.

* * * * *